(12) United States Patent
Chang et al.

(10) Patent No.: US 11,747,873 B2
(45) Date of Patent: Sep. 5, 2023

(54) REMOVABLE COMBINED PCIE RISER BRACKET FOR COMPUTING DEVICE

(71) Applicant: Quanta Computer Inc., Taoyuan (TW)

(72) Inventors: Chun Chang, Taoyuan (TW); Zhao-Hong Chen, Taoyuan (TW); Yi-Huang Chiu, Taoyuan (TW); Yu-Ta Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 490 days.

(21) Appl. No.: 16/996,674

(22) Filed: Aug. 18, 2020

(65) Prior Publication Data

US 2022/0057848 A1 Feb. 24, 2022

(51) Int. Cl.
| | |
|---|---|
| G06F 1/16 | (2006.01) |
| H05K 5/00 | (2006.01) |
| H05K 7/00 | (2006.01) |
| G06F 1/18 | (2006.01) |
| H05K 7/14 | (2006.01) |

(52) U.S. Cl.
CPC ............ *G06F 1/185* (2013.01); *H05K 7/1408* (2013.01); *H05K 7/1405* (2013.01); *H05K 7/1407* (2013.01)

(58) Field of Classification Search
CPC .... G06F 1/185; H05K 7/1408; H05K 7/1405; H05K 7/1407
See application file for complete search history.

(56) References Cited

U.S. PATENT DOCUMENTS

| | | | | |
|---|---|---|---|---|
| 6,618,260 B2* | 9/2003 | Willis | ..................... | G06F 1/184 361/679.48 |
| 7,746,630 B2* | 6/2010 | Tsai | ........................ | G06F 1/185 361/752 |
| 8,295,060 B2* | 10/2012 | Liu | .......................... | G06F 1/185 361/810 |
| 2002/0141170 A1* | 10/2002 | Rhoads | .................... | H05K 1/14 361/796 |
| 2004/0240173 A1* | 12/2004 | Yi | ........................ | H05K 7/1445 361/679.02 |
| 2010/0134989 A1* | 6/2010 | Strmiska | .............. | H05K 7/1418 361/759 |
| 2021/0357005 A1* | 11/2021 | Chang | ................... | C02F 1/5245 |

* cited by examiner

*Primary Examiner* — Anthony M Haughton
(74) *Attorney, Agent, or Firm* — NIXON PEABODY LLP

(57) ABSTRACT

A riser bracket assembly for supporting at least one expansion card horizontally over a motherboard is disclosed. The riser bracket assembly may support different types of expansion cards. The assembly includes a first component half having a registration feature to mate with a first type of riser board. A second component half is attachable to the first component half. The second component half has a registration feature to mate with a second type of riser board. A riser board has an edge connector insertable into a socket on the motherboard. The riser board includes an expansion card connector connectable to the at least one expansion card. The riser board supports either the first component half or the second component half.

19 Claims, 14 Drawing Sheets

REMOVABLE COMBINED PCIE RISER BRACKET FOR COMPUTING DEVICE

TECHNICAL FIELD

The present disclosure relates generally to systems and methods for attaching expansion cards to a computing device. More particularly, aspects of this disclosure relate to a riser bracket assembly for the installation of different types of expansion cards in a computing device.

BACKGROUND

Computer servers are computer devices generally designed for certain specialized functions. Servers generally include common components such as processors, memory, a cooling system, and a power system. Generally, servers have a chassis that contains walls of a certain height that may be standardized for insertion of the chassis in racks in a data center. The chassis generally holds a motherboard with the basic components such as the processors, dual in line memories (DIMMs), storage devices, fans, and power supplies. Servers can be specially designed to enhance performance of certain functions. For example, an application server may have relatively more processors for processing applications or a storage server may have more storage devices for more storage capability. However, it is often desirable to expand the functions of the server though additional components, such as network interface cards, memories, or processors.

Various protocols allow a user the flexibility of adding or enhancing functions in a computer system through additional hardware expansion cards. Such expansion cards are essentially smaller circuit boards that may be inserted in the server chassis and include functional components that may be electrically connected to the other server components. One well-known standard for communication between server components is the peripheral component interconnect express (PCIe) standard. Thus, a server will often include PCIe compatible slots that allow the insertion of PCIe compliant expansion cards to expand the functionality of the server.

The server chassis is height-limited because it must generally be fit in a single slot of a rack with multiple slots holding other servers. Thus, such expansion cards cannot be supported vertically on the surface of the mother board because the card would exceed the height of the chassis. PCIe expansion cards are therefore typically installed on the motherboard in specially designed riser brackets that suspend the card horizontally above the motherboard. Thus, the riser bracket reorients the card so it is supported parallel to the motherboard. This structure does not exceed the height of the walls of the chassis.

Known riser brackets include a riser board that plugs into the server motherboard and provides additional slots for the insertion of adapter cards in a generally parallel orientation with the motherboard. Because the riser bracket rises above the system board, it enables users to connect additional cards to the system in an orientation that is parallel to the system board and thus save space within the chassis.

PCIe cards come in a variety of sizes such as full-height, full-length (FHFL) cards, half-height, full-length (HHFL) cards, and half-height, half-length (HHHL) cards. However, current riser brackets are tailored specifically to one size of PCIe cards and thus, this makes adding functionality difficult since if a user desires to add a different sized card to a motherboard, a different riser bracket must be used. For example, a riser bracket for a full-height, full-length card cannot be used to support a half-height half-length card. Thus, if a user requires the half-height half-length card, a different riser bracket must be used.

Thus, there is a need for an adaptable riser that may accommodate different sized cards. There is also a need for a generic expansion card riser structure that may be separated into different components that may each support different sized expansion cards.

SUMMARY

One disclosed example is a riser bracket assembly for supporting at least one expansion card horizontally over a motherboard. The assembly includes a first component half having a registration feature to mate with a first type of riser board. A second component half is attachable to the first component half. The second component half has a registration feature to mate with a second type of riser board. A riser board has an edge connector insertable into a socket on the motherboard. The riser board includes an expansion card connector connectable to the at least one expansion card. The riser board supports either the first component half or the second component half.

A further implementation of the example riser assembly is an embodiment where the expansion card is a PCIe-type card. Another implementation is where the first type of riser board includes two PCIe-type connectors mounted on opposite surfaces. The at least one expansion card is connectable to one of the two PCIe-type connectors. Another implementation is where the first type of riser board supports both a full-height and a half-height PCIe expansion card. Another implementation is where another expansion card is supported by the second component half and is connected into the other of the two PCIe-type connectors. Another implementation is where the second type of riser board supports a half-height PCIe expansion card. Another implementation is where the first component half includes a support plate attachable to the first type of riser board. Another implementation is where the first type of riser board includes at least one aperture that mates with the registration feature. The registration feature is a pin on the support plate. Another implementation is where the first component half includes a rotating locking latch spaced distally from the support plate. The locking latch has a rotated position to secure the at least one expansion card. Another implementation is where the second component half includes a support plate attachable to the second type of riser board and a rotating locking latch spaced distally from the support plate. The locking latch has a rotated position to secure the at least one expansion card. Another implementation is where the first half component and the second half component are attached via rotational fixture. The second half component is rotated around the rotational fixture to align with the first half component.

Another disclosed example is a computing system having a chassis and a circuit board installed on the chassis. The circuit board includes a PCIe expansion socket. The computing system includes a riser bracket assembly including a first component half having a registration feature to mate with a first type of riser board. The riser bracket assembly also includes a second component half attachable to the first component half. The second component half has a registration feature to mate with a second type of riser board. A riser board has an edge connector insertable into the PCIe expansion socket on the circuit board. The riser board includes a first PCIe connector connectable to at least one PCIe expansion card. The riser board supports either the first component half or the second component half. Both component halves, the first component half alone or the second component half alone are installable on the circuit board.

A further implementation of the example computer system is an embodiment where the riser board is the first type of riser board. The riser board includes a second PCIe connector mounted on opposite surface from a surface mounting the first PCIe connector. The at least one expansion card is connectable to one of the two PCIe connectors. Another implementation is where the first type of riser board supports both a full-height and a half-height PCIe expansion card. Another implementation is where a second PCIe expansion card is supported by the second component half and is connected into the second PCIe connector. Another implementation is where the second type of riser board supports a half-height PCIe expansion card. Another implementation is where the first component half includes a support plate attachable to the first type of riser board and the second component half includes a support plate attachable to the second type of riser board. Another implementation is where the first type of riser board includes at least one aperture that mates with the registration feature. The registration feature is a pin on the support plate. Another implementation is where the first component half includes a rotating locking latch spaced distally from the support plate. The locking latch has a rotated position to secure the first PCIe expansion card. The second component half includes a rotating locking latch spaced distally from the support plate. The locking latch has a rotated position to secure the second PCIe expansion card. Another implementation is where the first half component and the second half component are attached via a rotational fixture. The second half component is rotated around the rotational fixture to align with the first half component.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1A:
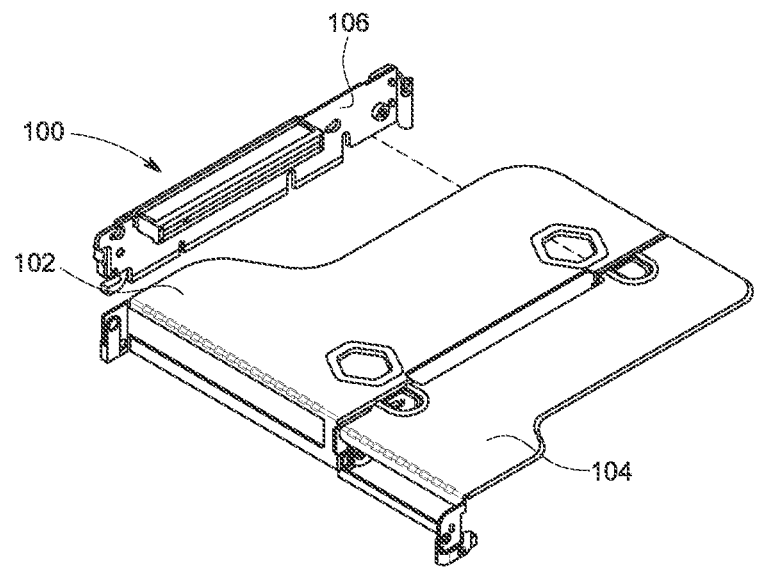
FIG. 1A is a perspective view of an example adaptable riser bracket assembly.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to an adaptable riser bracket for supporting different sized expansion cards such as PCIe cards. The riser bracket has two half components that may each be assembled with different types of riser boards. Each half component and corresponding riser board may support a single half-length PCIe card. Alternatively, both half components may be attached together to hold a riser board that will support two different half-length PCIe cards.

FIG. 1A is a perspective view of an example adaptable riser bracket assembly 100 that allows for the connection and support of different types of PCIe expansion cards. The riser bracket assembly 100 includes a riser component half 102, a mating opposite riser component half 104, and a riser board 106. As will be explained below, the riser component halves 102 and 104, either alone or combined allow support of different types of PCIe cards. The PCIe cards are plugged into a PCIe connector on the riser board 106. Electronic connection is achieved by plugging in a connector on the riser board 106 to a PCIe expansion socket on a motherboard or other circuit board.

Figure 1B:
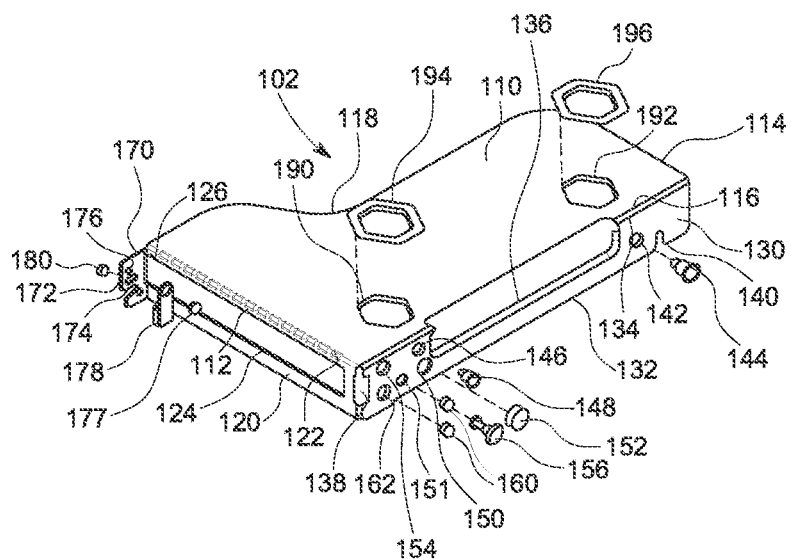
FIG. 1B is an exploded perspective view of a half component of the example riser bracket assembly in FIG. 1A.
Figure 1C:
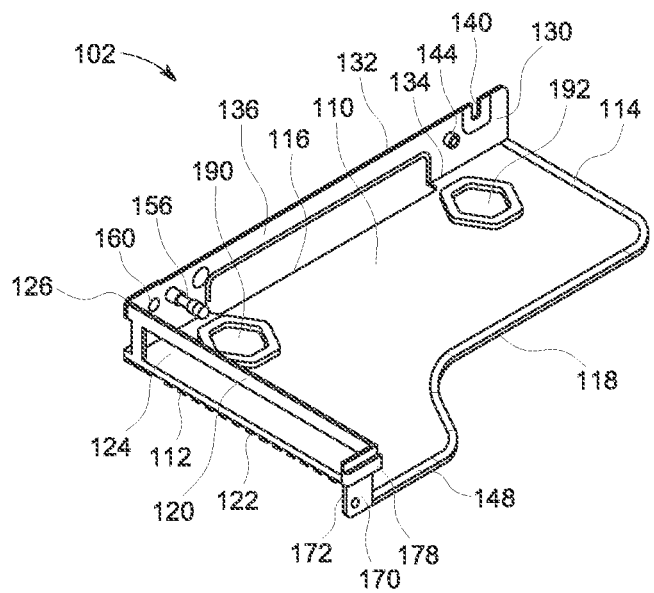
FIG. 1C is an opposite side perspective view of the example half component in FIG. 1B.

FIG. 1B is an exploded perspective view of the parts of the riser component half 102 in FIG. 1A. FIG. 1C is an opposite perspective of the assembled riser component half 102. The riser component half 102 includes a substantially rectangular top plate 110. The top plate 110 includes an access edge 112 and an opposite short edge 114. A side 116 is generally linear, while an opposite side 118 includes transitional curve that allows the transition between the access edge 112 and the short edge 114. The distance between the sides 116 and 118 define the length of the top plate 110. The top plate 110 is generally the height of a full-height PCIe card.

An access flap 120 is attached to the access edge 112. The attachment between the access flap 120 and the edge 112 includes perforations 122. The perforations 122 allow for air flow to the inserted PCIe cards. The access flap 120 includes an aperture 124 that allows access to a grill structure on a PCIe card attached to the component half 102. The aperture 124 thus allows air flow to a PCIe card attached to the component half 102. A front frame 126 extends between one end of the edge 112 to the other end. The side 116 is connected to a riser board support plate 130 that extends perpendicularly from the top plate 110. The support plate 130 includes a bottom edge 132 and an opposite top edge 134 that is joined to the side 116. A cutout 136 is defined at the top edge 134 to accommodate a connector of a riser board. The support plate 130 includes a leading edge 138 that engages one end of the flap 120 when the flap 120 is rotated in the down position.

The bottom edge 132 includes a notch 140 near the short edge 114. The support plate 130 includes a hole 142 between the short edge 114 and one end of the cutout 136. A T-pin 144 is inserted in the hole 142. As will be explained, the T-pin 144 is an example registration feature used to engage a riser board. Another hole 146 is located proximate the opposite end of the cutout 136. Another registration feature, such as a T-pin 148, is inserted in the hole 146 to engage a riser board.

Another hole 150 is formed near the opposite end of the cutout 136. A T-pin 152 is inserted in the hole 150. The T-pin 152 is used to attach the component half 104 (in FIG. 1A) to the component half 102. Another hole 154 is formed between the leading edge 138 and the holes 146 and 150. A T-pin 156 is inserted in a hole 151. The T-pin 156 is employed to lock the riser board 106 to the component half 102 as will be explained. Rivets 160 are provided in holes 154 and 162 to attach the support plate 130 to the front frame 126.

A support tab 170 is suspended from the flap 120 opposite the end in contact with support plate 130. The support tab 170 has an outer edge 172 that forms a notch 174. A slot 176 is formed through the support tab 170. The slot 176 supports a locking latch 178 that is connected through the slot 176 by a hinge 177. The locking latch 178 may be rotated between an open position and a locked position to hold the PCIe card. A pin 180 is inserted through a hole in the support tab 170 to engage the inserted PCIe card.

Touchpoints are defined by holes 190 and 192 formed in the top plate 110. The holes 190 and 192 allow a user to hold the component half 102 without damaging the component half 102 and any attached riser board or expansion cards. Decal labels 194 and 196 are applied to the surface of the top plate 110 around the holes 190 and 192 to highlight them.

Figure 1D:
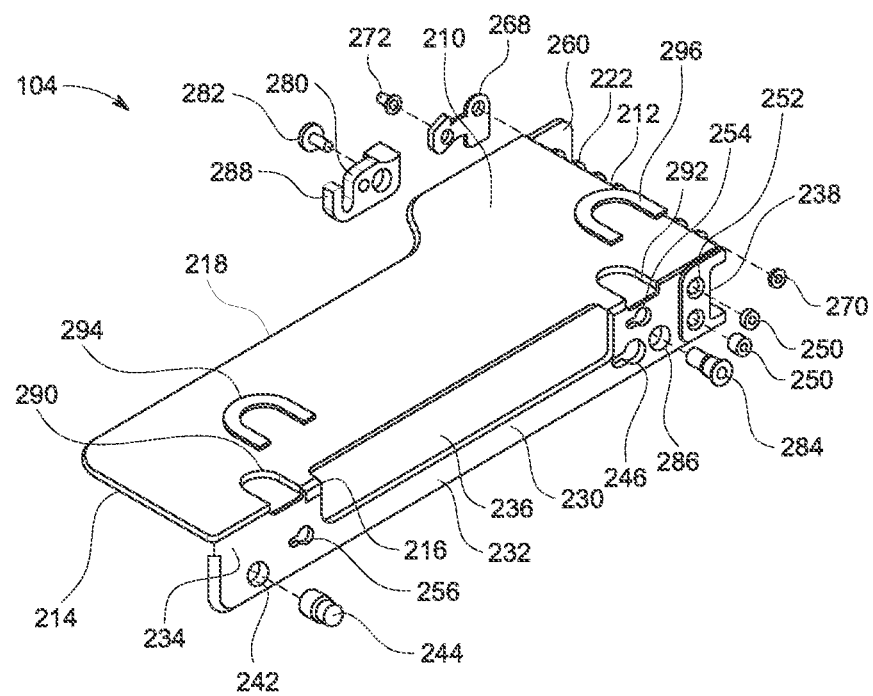
FIG. 1D is an exploded perspective view of the opposite half component of the example riser bracket assembly in FIG. 1A.
Figure 1E:
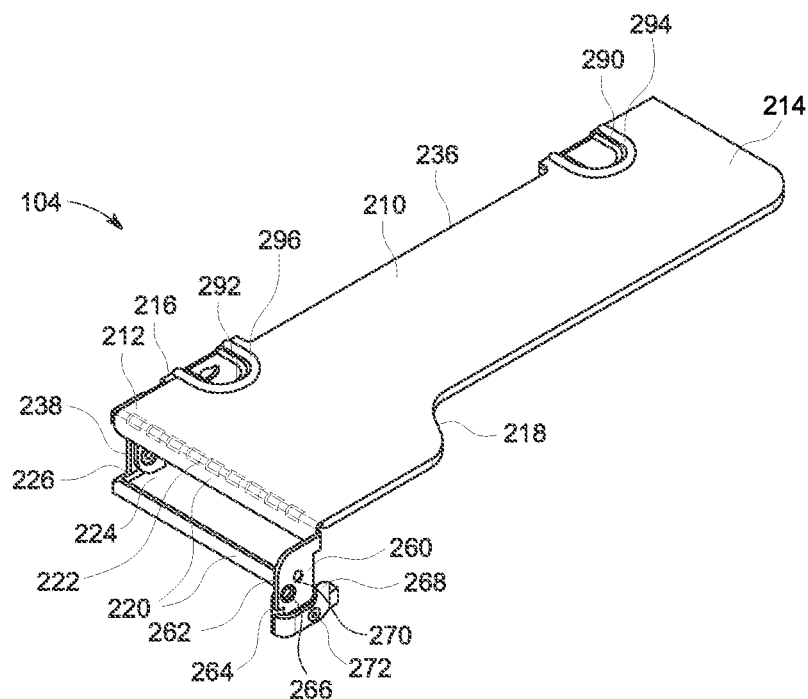
FIG. 1E is a perspective view of the assembled opposite half component of the example riser bracket in FIG. 1D.
Figure 1F:
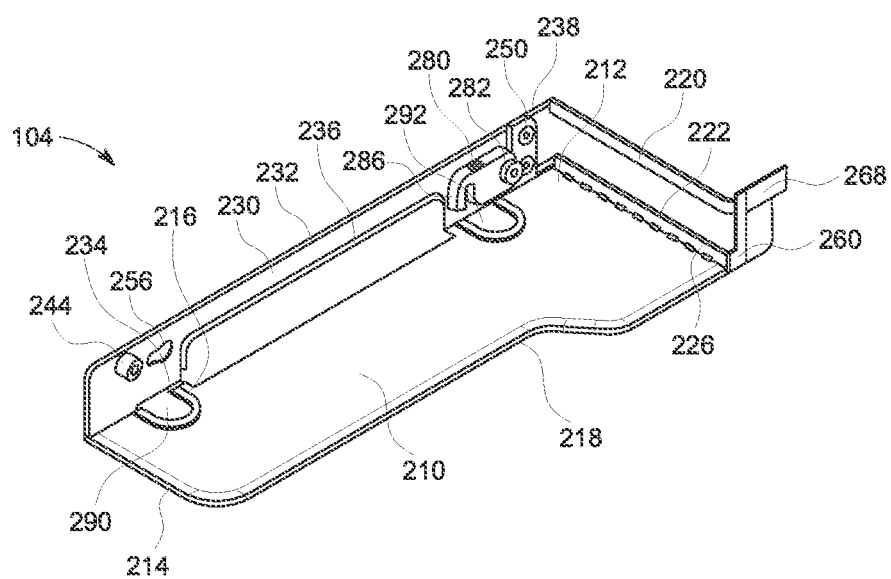
FIG. 1F is an opposite side perspective view of the opposite half component of the example riser bracket in FIG. 1D.

FIG. 1D is an exploded perspective view of the components of the mating riser component half 104 of the example riser bracket assembly 100. FIG. 1E is a perspective view of the assembled components of the mating riser component half 104. FIG. 1F is an opposite side perspective view of the assembled riser component half 104. The riser component half 104 includes a substantially rectangular top plate 210. The top plate 210 is generally the height of a half-height PCIe card. The top plate 210 includes an access edge 212 and an opposite short edge 214. A side 216 is generally linear, while an opposite side 218 includes curved region that allows the transition between the access edge 212 and the shorter edge 214.

An access flap 220 is attached to the access edge 212. Perforations 222 are formed on the attachment of the access flap 220 and access edge 212 to facilitate air flow to a PCIe card. The access flap 220 includes an aperture 224 allows access to a grill structure on attached PCIe cards to allow air flow to the PCIe card. A rectangular frame 226 extends from the access edge 212. The side 216 is attached to a riser board support plate 230 that extends perpendicularly from the top plate 210. The support plate 230 includes a bottom edge 232 and an opposite top edge 234 that is joined to the side 216. A cutout 236 is defined at the top edge 234 to accommodate the connector of a riser board. The support plate 230 includes a leading edge 238 that engages one end of the flap 120 (in FIG. 1C) when the flap 120 is rotated in the down position.

The support plate 230 includes a hole 242 located proximate to one end of the cutout 236. An auto-lock plunger 244 is inserted in the hole 242 to hold the component halves 102 and 104 together. A keyhole aperture 246 is formed near the opposite end of the cutout 236. The keyhole aperture 246 accepts the T-pin 152 of the opposite component half 102 shown in FIG. 1B when the component halves 102 and 104 are joined together. Rivets 250 are provided in holes 252 to attach the support plate 230 to the rectangular frame 226. A registration feature such as a keyhole aperture 254 is located near one end of the cutout 236 to accept a pin on a riser board to locate the riser board relative to the support plate 230. Another registration features such as a keyhole aperture 256 is located on the opposite end of the cutout 236 to accept a pin on a riser board to locate the riser board relative to the support plate 230.

A support tab 260 is suspended from the frame 226 opposite the end in contact with the support plate 130 (in FIG. 1B). The support tab 260 has an outer edge 262 that forms a notch 264. A slot 266 is formed through the support tab 260. The slot 266 supports a locking latch 268 that is connected through the slot 266 by a hinge 270. The locking latch 268 may be rotated between an open position and a locked position about the hinge 270 to hold the PCIe card. A pin 272 (in FIG. 1D) is inserted through a hole in the support tab 260 to engage the inserted PCIe card.

A locking fixture 280 is provided that includes a hole that allows the mating of a screw 282 to a nut 284. The screw 282 and nut 284 attach the locking fixture through a hole 286 in the support plate 230. The locking fixture 280 includes a hook member 288. As will be explained, the locking fixture 280 rotates around the screw 282 to engage the hook member 288 with a pin from a riser board.

Figure 2A:
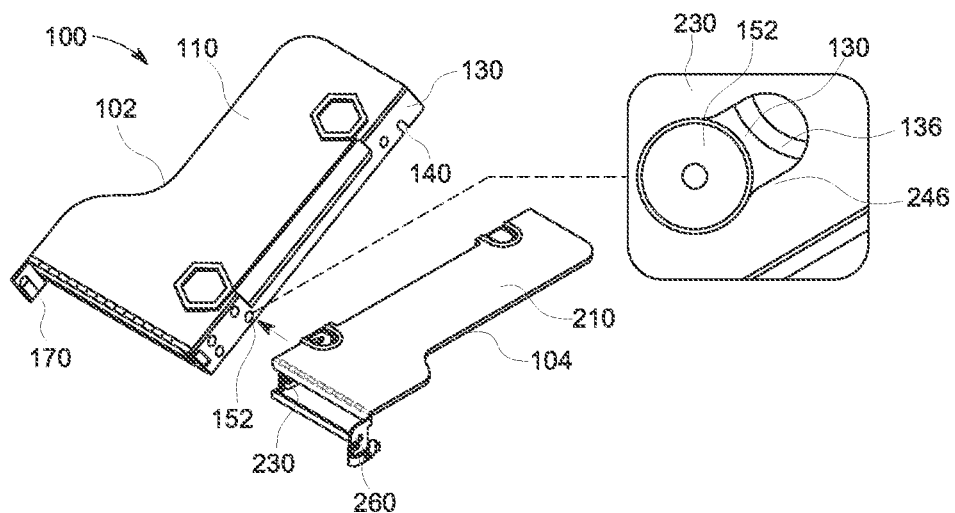
FIG. 2A is a perspective view of the half components of the example riser bracket in position for assembly.
Figure 2B:
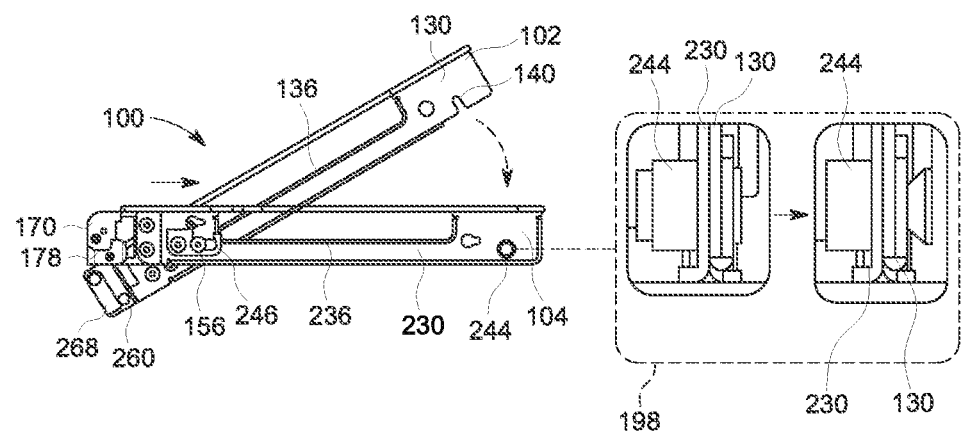
FIG. 2B is a side view of the half components of the example riser bracket being assembled.

Touchpoints are defined by holes 290 and 292 formed in the top plate 210. The holes 290 and 292 allow a user to hold the component half 104 without damaging an attached riser board and/or an attached expansion card. Decal labels 294 and 296 are applied to the surface of the top plate 210 around the holes 290 and 292 to highlight them As explained above, the two component halves 102 and 104 may be used separately in conjunction with different riser boards to support half-length PCIe cards, or may be joined together and used in conjunction with a single riser board to support two half-length PCIe cards. FIG. 2A is a perspective view of the component halves 102 and 104 of the example riser bracket 100 in position for assembly, and FIG. 2B is a side view of the component halves 102 and 104 of the example riser bracket 100 being assembled. Like elements in FIGS. 2A-2B are labeled by like element numbers to their counterparts in FIGS. 1A-1F.

The two component halves 102 and 104 are placed an angle relative to each other as shown in FIG. 2A. The T-pin 152 of the component half 102 is inserted in the keyhole aperture 246 of the opposite component half 104. As is shown in the inset in FIG. 2A, the keyhole aperture 246 has one end that is roughly circular in shape that is a larger diameter that the head of the T-pin 152. The opposite end of the keyhole aperture 246 is narrower in diameter, and thus locks the T-pin 152 to the support plate 230 of the component half 104 when the T-pin 152 slides to the opposite end of the keyhole aperture 246. Thus, the component half 104 is pushed to where the head of the T-pin 152 engages the circular end of the keyhole aperture 246. The T-pin 152 is then locked to the opposite narrower end of the keyhole aperture 246. The joined component halves 102 and 104 may then be pivoted in planar alignment with each other around the T-pin 152. Once the top plates 110 and 210 are roughly in planar alignment, the auto-lock plunger 244 engages the notch 140 of the support plate 130 of the component half 102. As shown in an inset 198, the auto-lock plunger 244 may be locked into place in the notch 140 automatically, by pushing a spring-loaded button that will detach the plunger 244 from the notch 140.

Figure 3A:
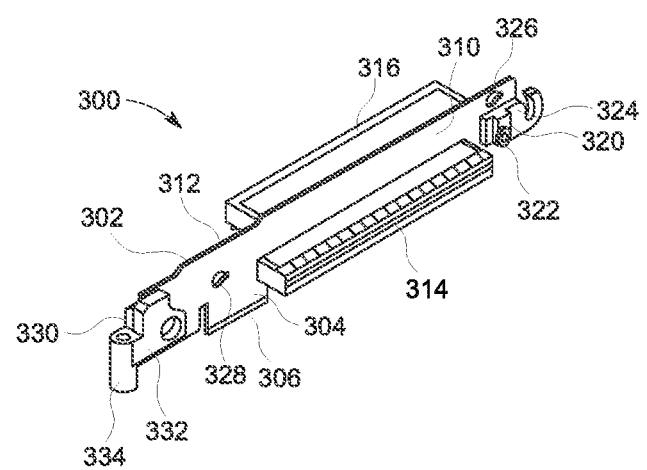
FIG. 3A is a perspective view of an example riser board that may be supported by the example riser bracket in FIG. 2A-2B.

FIG. 3A is a perspective view of an example riser board 300 that may be added to the example riser bracket 100 in FIG. 1A as the riser board 106. The riser board 300 may support one full-height half-length expansion card, one half-height half-length expansion card, or both one full-height half-length card and one half-height half-length expansion card. The riser board 300 engages registration features on the component half 102 (in FIG. 1A). The riser board 300 includes a top edge 302 and an opposite bottom edge 304. The bottom edge 304 includes a connector tab 306 with connectors such as golden finger connectors that may be inserted in a motherboard socket. The riser board 300 includes opposite surfaces 310 and 312. A PCIe connector 314 is mounted on the surface 310. Another PCIe connector 316 is mounted on the opposite surface 312.

One end of the riser board 300 includes a locking fixture 320 that is attached to the riser board 300 via a screw 322. The locking fixture 320 rotates around the screw 322 and includes a hook member 324 that may be used to secure the riser board 300 to the component half 102. An aperture 326 is formed near the locking fixture 320 for guiding the mating of the riser board 300 to the component half 102. Another aperture 328 is formed near opposite end of the riser board 300 for guiding the mating of the riser board 300 to the component half 102. The opposite end of the riser board 300 includes a vertical post structure 330 that has a support member 332 attached to the riser board 300. The support member 332 is attached to a vertical post 334 that provides a guiding function for the riser board 300 when mating to a motherboard.

Figure 3B:
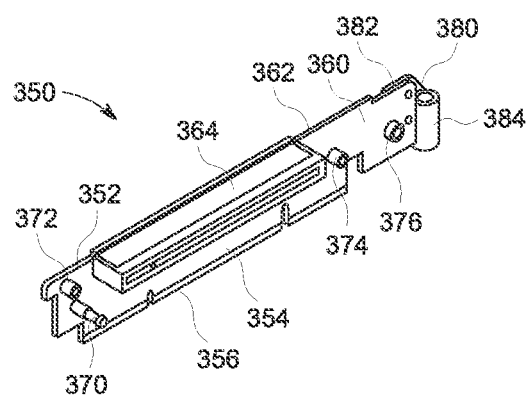
FIG. 3B is a perspective view of another example riser board type that may be supported by the opposite half component shown in FIGS. 1D-1F.

FIG. 3B is a perspective view of another type of riser board 350 that may be attached to the example component half 104 in FIGS. 1D-1F. The riser board 350 may support a single half-height half-length expansion card. The riser board 350 includes a top edge 352 and an opposite bottom edge 354. The bottom edge 354 includes a connector tab 356 with connectors, such as golden finger connectors that may be inserted in a motherboard socket. The riser board 350 includes opposite surfaces 360 and 362. A PCIe connector 364 is mounted on the surface 360. One end of the surface 360 of the riser board 300 includes a T-pin 370 that mates with the locking feature 280 on the support plate 230 (in FIG. 1F) of the component half 104. A pin 372 extends from the surface 360 near the T-pin 370. The opposite end of the riser board 300 also includes a pin 374. A SMT nut 376 extends from the opposite end of the riser board 350. The opposite end of the riser board 350 includes a vertical post structure 380 that has a support member 382 attached to the riser board 350 via a screw attached to the SMT nut 376. The support member 382 is attached to a vertical post 384 that may be secured to the motherboard.

Figure 4A:
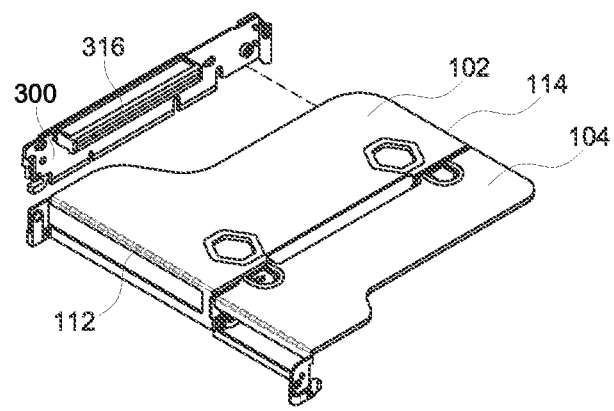
FIG. 4A shows the example assembled riser bracket in FIG. 1A prior to attaching the example riser board in FIG. 3A.
Figure 4B:
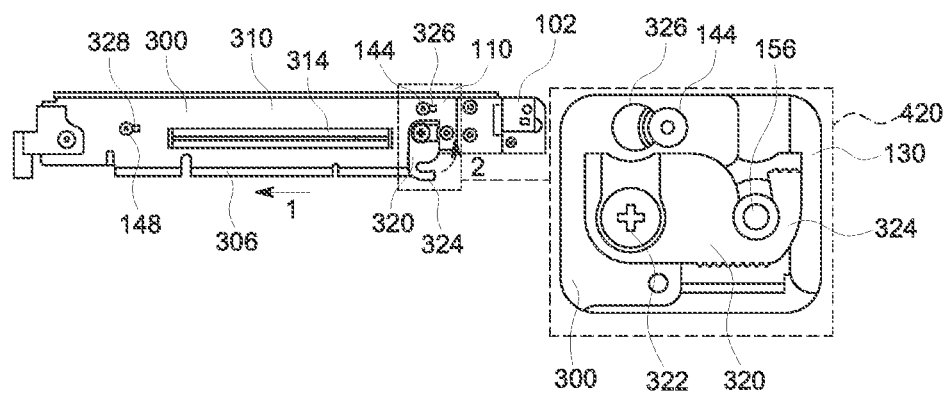
FIG. 4B is a side cutaway view of the attachment of the riser board to the assembled riser in FIG. 4A.

FIGS. 4A-4F show the process of assembling the riser assembly 100 with expansion cards such as a PCIe full-height half-length card 410 and a PCIE half-height half-length card 412, and installation in a computing device. Like elements in FIGS. 4A-4F are labeled with the same reference numbers as their counterparts in FIGS. 1-3. As explained above in relation to FIGS. 2A-2B, both component halves 102 and 104 of the riser assembly 100 are attached together. The riser board 300 in FIG. 3A is then attached to the support plate 130 of the component half 102 as shown in FIG. 4A. FIG. 4B is a side view of the attachment of the riser board 300 to the support plate 130 of the component half 102. The riser board 300 is moved in the direction from the edge 112 to the edge 114 (in FIG. 4A) of the top plate 110 in proximity to the support plate 130. Registration features such as the T-pins 144 and 148 of the support plate 130 are inserted into the apertures 326 and 328 on the riser board 300. The locking fixture 320 is rotated so the hook member 324 engages the T-pin 156 extending from the support plate 130 as shown in an inset 420.

Figure 4C:
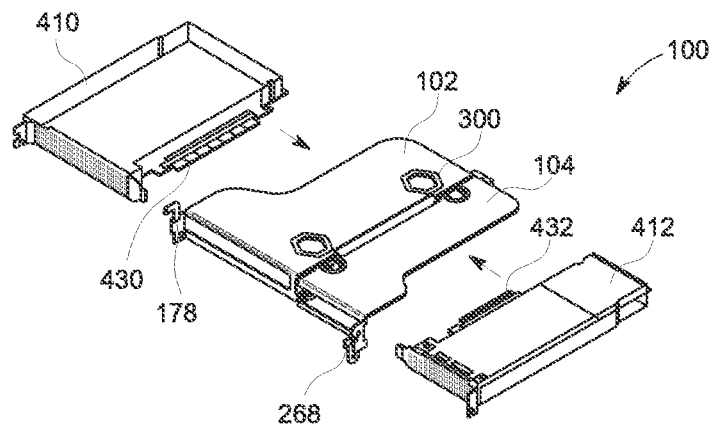
FIG. 4C is a perspective view of example PCIe cards prior to attachment to the riser board of the completed assembled riser bracket in FIG. 4A.
Figures 4D, 4E:
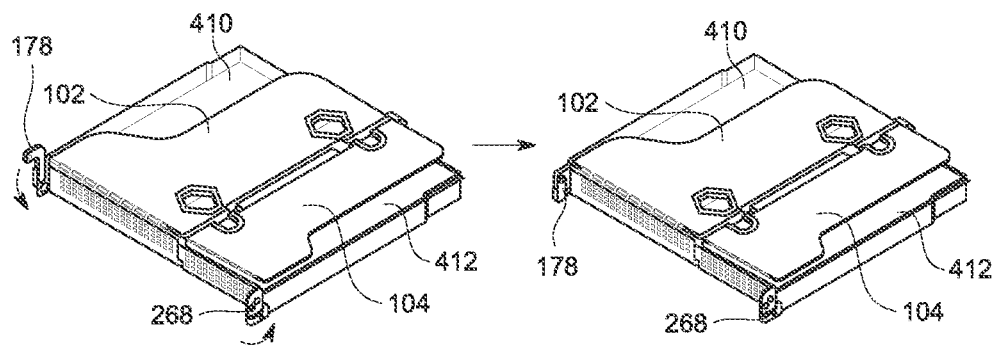
FIGS. 4D-4E show the deployment of a locking lever to fix the PCIe cards in place after attachment to the riser board in FIG. 4C.

Two PCIe cards 410 and 412 shown in FIG. 4C are then attached to the riser board 300 as shown in FIG. 4D. In this example, the PCIe card 410 is a full-height half-length size. The PCIe card 410 includes a connector edge 430. The connector edge 430 of the PCIe card 410 is inserted in the PCIe connector 314 (in FIG. 3A). The locking latch 178 is then rotated to lock in the PCIe card 410 to the riser component half 102 as shown in FIG. 4E.

In this example, the PCIe card 412 is a half-height, half-length size. The PCIe card 412 includes a connector edge 432. The connector edge 432 of the PCIe card 412 is inserted in the PCIe connector 316 (in FIG. 3A) on the opposite side of the riser board 300 as shown in FIG. 4C. The locking latch 268 of the other component half 104 is then rotated to lock in the PCIe card 412, as shown in FIG. 4E.

Figure 4F:
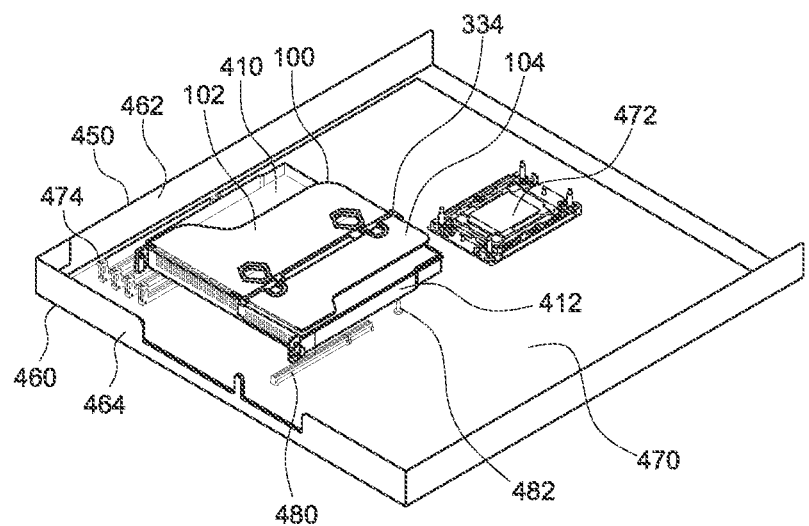
FIG. 4F shows the completed PCIe cards and riser bracket assembly before insertion in an example server chassis.

FIG. 4F is a perspective view of the assembled component halves 102 and 104 of the riser assembly 100 with the attached PCIe cards 410 and 412 being installed in a computing device such as a server 450. The sever 450 includes a chassis 460 with a side wall 462 and a front wall 464. The front wall 464 has a cutout to allow access to the PCIe cards 410 and 412. A circuit board such as a motherboard 470 is mounted at the bottom of the chassis 460 within the enclosure created by the walls 462 and 464. The motherboard 470 includes one or more components such as power supplies, processors such as CPUs, network interface cards, memory devices and the like.

Figure 4G:
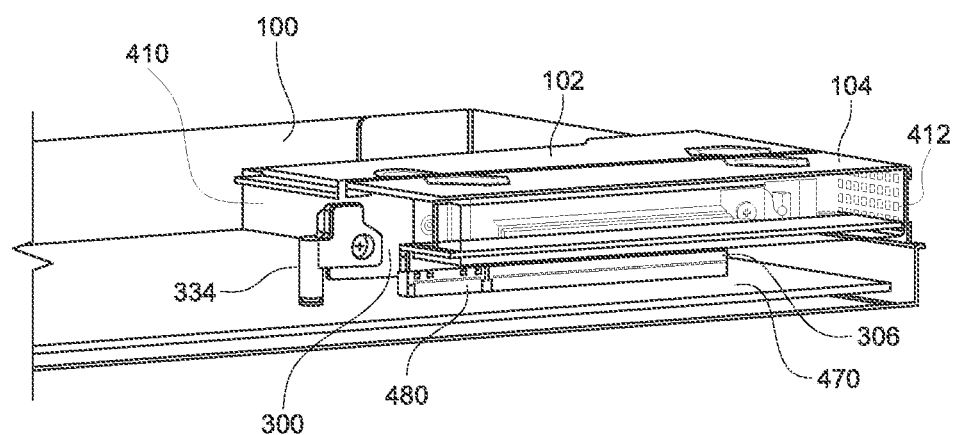
FIG. 4G shows the completed PCIe card and riser bracket assembly fully inserted in the example server chassis.

In this example, the motherboard 470 includes a processor 472 and dual inline memory module slots 474. A PCIe expansion socket 480 is located next to the dual inline memory module slots 474. A location pin 482 extends upward from the motherboard 470 near one end of the socket 480. The connector tab 306 of the riser board 300 (in FIG. 3A) is inserted in the PCIe socket 480. The vertical post 334 of the riser board 300 is inserted on the location pin 482. Thus, the riser bracket assembly 100 suspends the PCIe cards 410 and 412 above the motherboard 470 as shown in FIG. 4G.

Figure 5A:
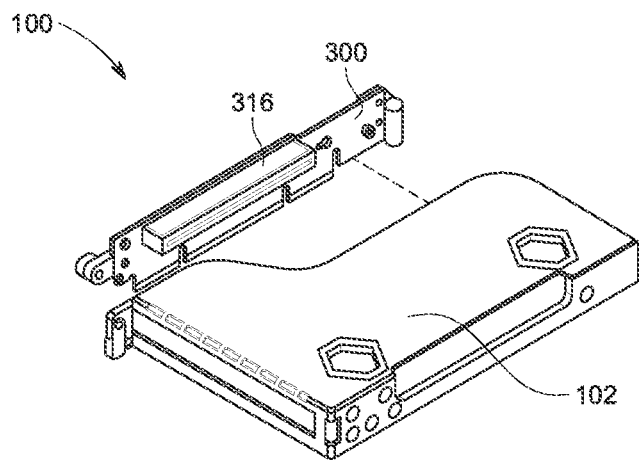
FIG. 5A shows the example half component of the riser bracket in FIG. 1B prior to attaching the example riser board in FIG. 3A.
Figure 5B:
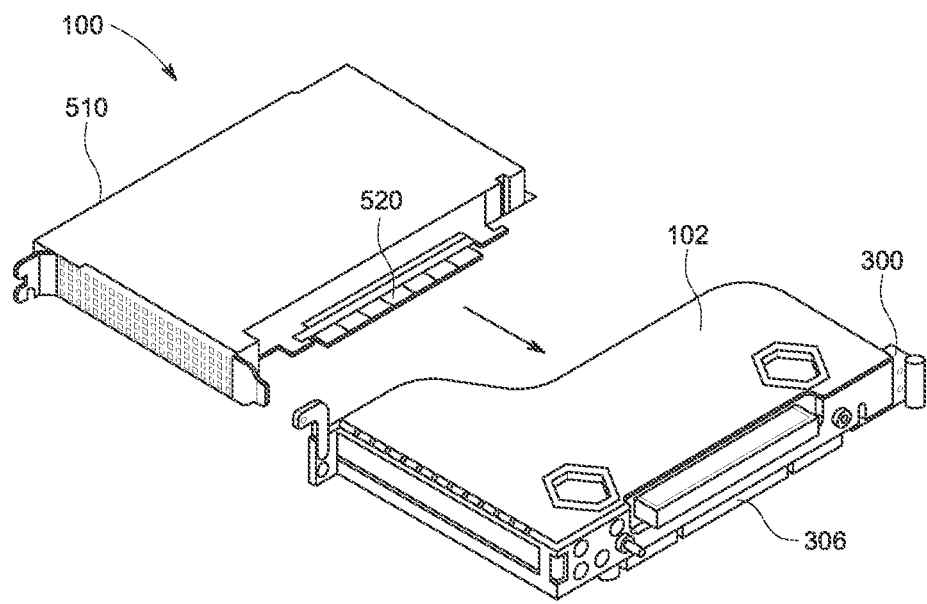
FIG. 5B is a perspective view of an example PCIe card prior to attachment to the riser board of the completed assembled riser bracket in FIG. 5A.

FIGS. 5A-5F show an alternate assembly of the riser assembly 100 for the installation of a single full height half-length PCIe card 510. Like elements in FIGS. 5A-5F are labeled with the same reference numbers as their counterparts in FIGS. 1-3. In this example, only the component half 102 is used since only a single card 510 is required. The riser board 300 in FIG. 3A is attached to the support plate 130 of the half component 102 as shown in FIG. 5A.

The same process explained above in reference to FIG. 4B is used to attach the riser board 300 to the support plate 130 of the component half 102. Thus, the T-pins 144 and 148 of the support plate 130 are inserted into the apertures 326 and 328 on the riser board 300. The locking fixture 320 is rotated so the hook member 324 engages the T-pin 156 extending from the support plate 130, as shown in an inset 420.

Figures 5C, 5D:
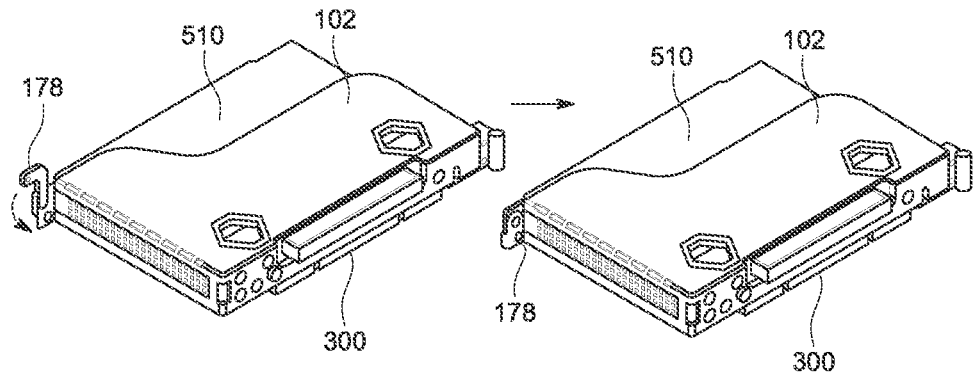
FIGS. 5C-5D show the deployment of a locking lever to fix the PCIe card in place after attachment to the riser board in FIG. 3A.

In this example, the PCIe card 510 includes a connector edge 520. The connector edge 520 of the PCIe card 510 is inserted in the PCIe connector 314 resulting in the attached PCIe card 510 as shown in FIG. 5C. The locking latch 178 is then rotated to lock in the PCIe card 510 to the riser component half 102 as shown in FIG. 5D. Since only one card is required, the riser component half 104 is not used. Nothing is connected to the PCIe connector 316 on the opposite of the riser board 300.

Figure 5E:
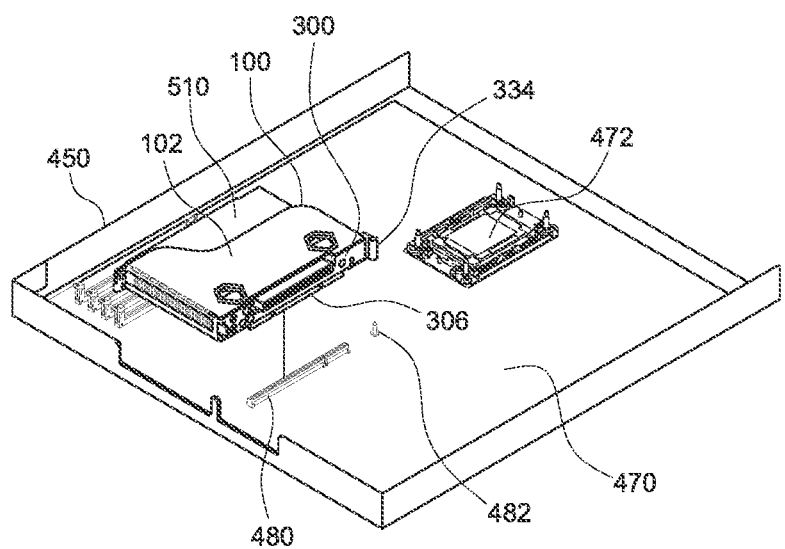
FIG. 5E shows the completed PCIe card and riser bracket assembly before insertion in an example server chassis.
Figure 5F:
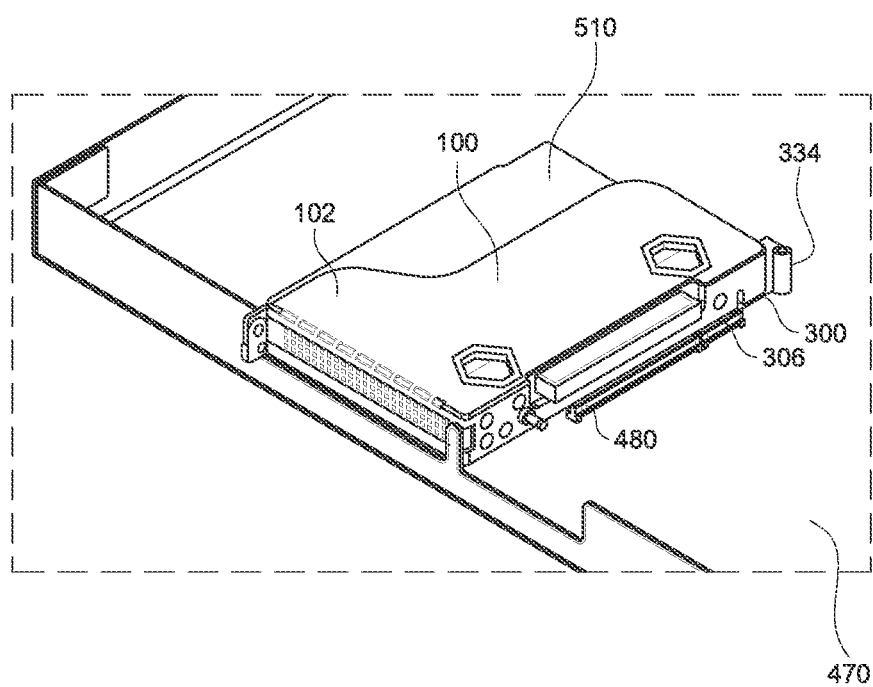
FIG. 5F shows the completed PCIe card and riser bracket assembly fully inserted in the example server chassis.

FIG. 5E is a perspective view of the assembled component half 102 with the attached PCIe card 510 and the server 450 previously described in reference to FIG. 4F. The connector tab 306 of the riser board 300 is inserted in the PCIe socket 480. The vertical post 334 of the riser board 300 is inserted on the location pin 482. Thus, the component half 102 and riser board 300 of the riser assembly 100 suspends the PCIe card 510 above the motherboard 470.

Figure 6A:
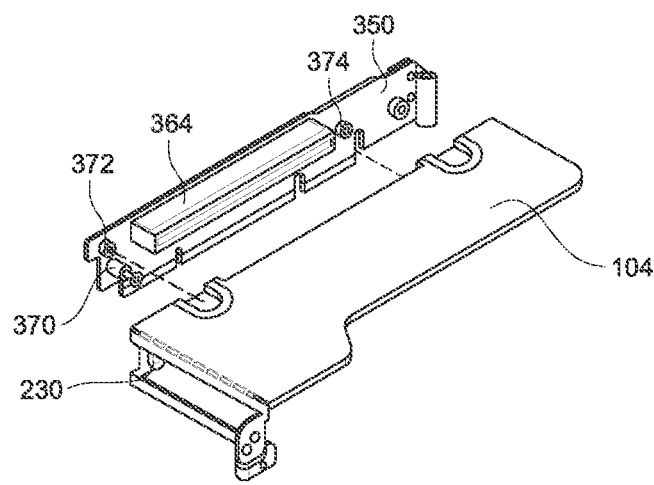
FIG. 6A shows the example opposite half component of the riser bracket in FIG. 1C prior to attachment of the example riser board in FIG. 3B.
Figure 6B:
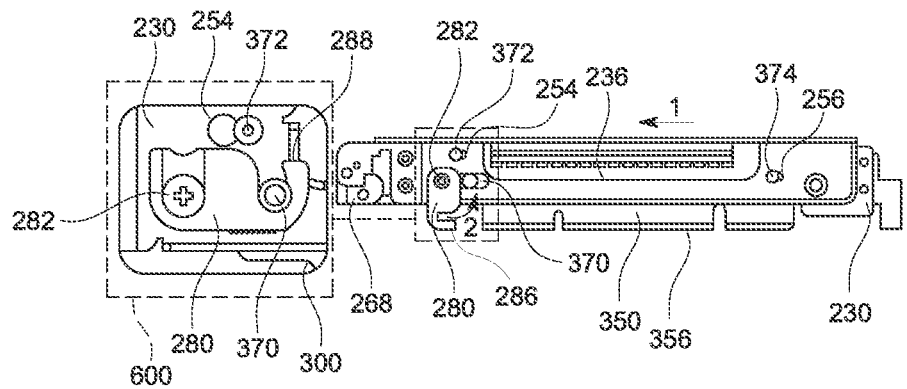
FIG. 6B is a side cutaway view of the attachment of the riser board to the assembled riser half component in FIG. 6A.

FIGS. 6A-6F show an alternate assembly of the riser assembly 100 for the installation of a single half-height half-length PCIe card 610. Like elements in FIGS. 6A-6F are labeled with the same reference numbers as their counterparts in FIGS. 1-3. FIG. 6A shows the example opposite component half 104 in FIG. 1C prior to attachment of the example riser board 350 in FIG. 3B. FIG. 6B is a side cutaway view of the attachment of the riser board 350 to the riser component half 104 in FIG. 6A. In FIG. 6B, the pins 372 and 374 of the riser board 350 are inserted in the respective apertures 254 and 256, in the support plate 230 of the component half 104. The T-pin 370 extends through the aperture 246 of the support plate 230 and mates with the locking feature 280. The PCIe connector 364 is inserted to extend from the cutout 236 of the support plate 230.

The riser board 350 is positioned in place by the insertion and movement of the pins 372 and 374 into the apertures 254 and 256, as shown in FIG. 6B. As shown in an inset 600, the hook member 288 of the locking fixture 280 is rotated in place to engage the pin 370 and thereby fix the riser board 350 to the support plate 230.

Figure 6C:
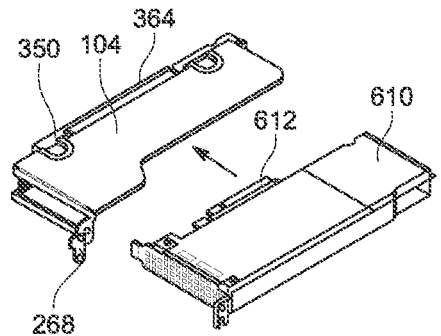
FIG. 6C is a perspective view of an example PCIe card prior to attachment to the riser board and riser half component in FIG. 6A.
Figures 6D, 6E:
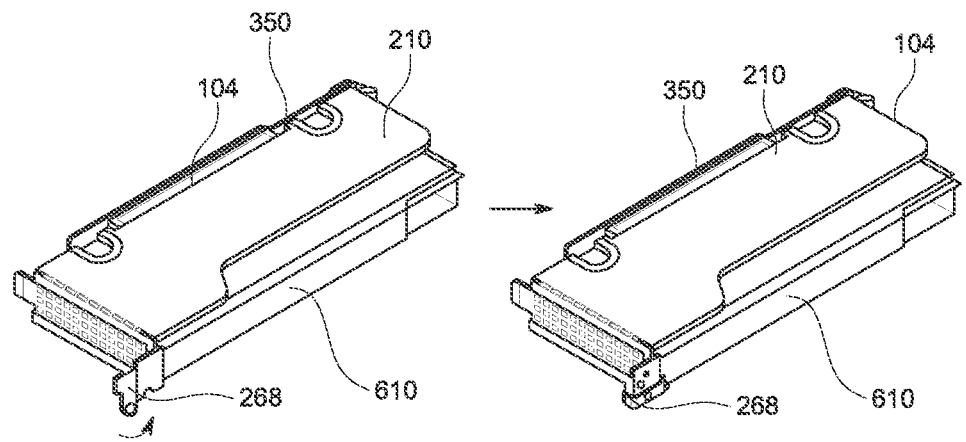
FIGS. 6D-6E show the deployment of a locking lever to fix the PCIe card in place after attachment to the riser board in FIG. 6C.

FIG. 6C is a perspective view of the example PCIe card 610 prior to attachment to the now assembled riser board 350 and component half 104. In this example, the PCIe card 610 includes a connector edge 612. The connector edge 612 of the PCIe card 610 is inserted in the PCIe connector 364 as shown in FIG. 6C. The locking latch 268 is then rotated to lock in the PCIe card 610 to the riser component half 104 as shown in FIGS. 6D and 6E. Since only one card is required, the riser component half 102 is not used.

Figure 6F:
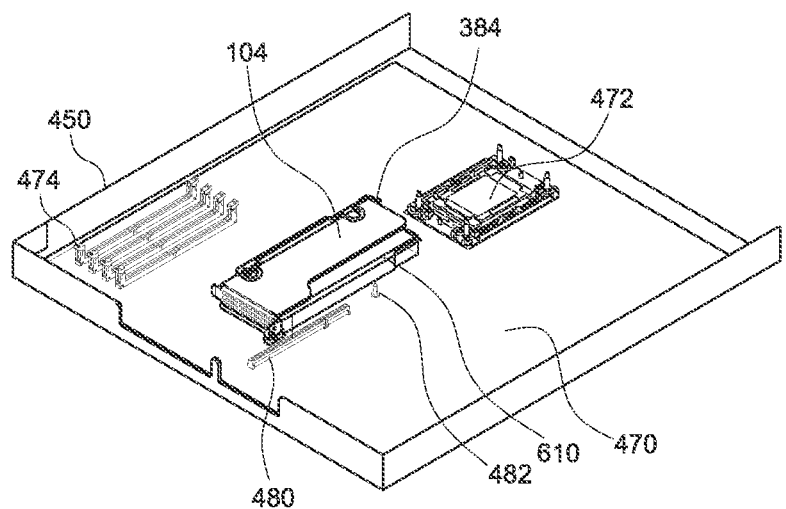
FIG. 6F shows the completed PCIe card and riser bracket assembly before insertion in an example server chassis.
Figure 6G:
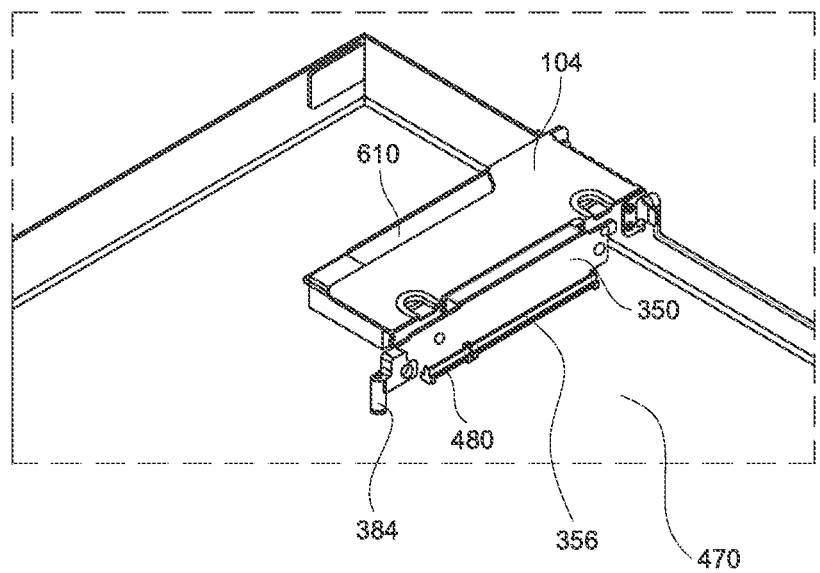
FIG. 6G shows the completed PCIe card and riser bracket assembly fully inserted in the example server chassis.

FIG. 6F shows the assembled PCIe card 610 and riser bracket component half 104 inserted in the example server 450 previously described in reference to FIG. 4F. The connector tab 356 of the riser board 350 is inserted in the PCIe socket 480. The vertical post 384 of the riser board 350 is inserted on the location pin 482. Thus, the riser bracket assembly component half 104 and attached riser board 350 suspend the PCIe card 610 above the motherboard 470.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A riser bracket assembly for supporting at least one expansion card horizontally over a motherboard, the assembly comprising:
    a first type of riser board having an edge connector insertable into a socket on the motherboard, a first expansion card connector connectable to a first type of expansion card, and a second expansion card connector connectable to a second type of expansion card;
    a first component half having a registration feature to mate with the first type of riser board;
    a second component half attachable to the first component half, the second component half having a registration feature to mate with a second type of riser board having an edge connector insertable into the socket on the motherboard and a single expansion card connector connectable to the second type of expansion card; and
    wherein the riser bracket assembly has a first configuration including the first component half and the second component half mated with the first type of riser board supporting the first type of expansion card, and a second configuration including only the second component half and the second type of riser board supporting the second type of riser board.

2. The riser bracket assembly of claim 1, wherein the first type of expansion card is a PCIe type card.

3. The riser bracket assembly of claim 2, wherein the first type of riser board supports both a full-height and a half-height PCIe expansion card.

4. The riser bracket assembly of claim 2, wherein another expansion card is supported by the second component half and is connected into the other of the two PCIe type connectors.

5. The riser bracket assembly of claim 2, wherein the second type of riser board supports a half-height PCIe expansion card.

6. The riser bracket assembly of claim 1, wherein the first component half includes a support plate attachable to the first type of riser board.

7. The riser bracket assembly of claim 6, wherein the first type of riser board includes at least one aperture that mates with the registration feature, wherein the registration feature is a pin on the support plate.

8. The riser bracket assembly of claim 6, wherein the first component half includes a rotating locking latch spaced distally from the support plate, the locking latch having a rotated position to secure the at least one expansion card.

9. The riser bracket assembly of claim 1, wherein the second component half includes a support plate attachable to the second type of riser board and a rotating locking latch spaced distally from the support plate, and wherein the locking latch has a rotated position to secure the at least one expansion card.

10. The riser bracket assembly of claim 1, wherein the first half component and the second half component are attached via a rotational fixture, wherein the second half component is rotated around the rotational fixture to align with the first half component.

11. The riser bracket assembly of claim 6, wherein the first component half has a perpendicular top plate, the support plate of the first component half configured to be attached in parallel to the first type of riser board and the top plate of the first component half configured to support a top surface of the first type of expansion card, and wherein the second component half has a support plate and a perpendicular top plate, the support plate of the second component half configured to be attached in parallel to the first type of riser board opposite the support plate of the first component half, and the top plate of the second component half configured to support a top surface of the second type of expansion card.

12. A computing system comprising:
    a chassis;
    a circuit board installed on the chassis, the circuit board including a PCIe expansion socket; and
    a riser bracket assembly including:
        a first type of riser board having an edge connector insertable into the PCIe expansion socket on the motherboard, a first expansion card connector connectable to a first type of PCIe expansion card, and a second expansion card connector connectable to a second type of PCIe expansion card;
        a first component half having a registration feature to mate with the first type of riser board;
        a second component half attachable to the first component half, the second component half having a registration feature to mate with a second type of riser board having an edge connector insertable into the PCIe expansion socket on the motherboard and a single PCIe expansion card connector connectable to the second type of PCIe expansion card; and
    wherein the first type of riser board supports the first component half and the first type of PCIe expansion card in a first configuration, wherein both component halves or the first component half alone are installable on the circuit board; and wherein the second component half alone is installable on the circuit board in a second configuration including the second type of riser board supporting the second type of riser board.

13. The computing system assembly of claim 12, wherein the first type of riser board supports both a full-height and a half-height PCIe expansion card.

14. The computing system of claim 12, wherein the second type of riser board supports a half-height PCIe expansion card.

15. The computing system of claim 12, wherein the first component half includes a support plate attachable to the first type of riser board, and wherein the second component half includes a support plate attachable to the second type of riser board.

16. The computing system of claim 15, wherein the first type of riser board includes at least one aperture that mates with the registration feature, wherein the registration feature is a pin on the support plate.

17. The computing system of claim 15, wherein the first component half includes a rotating locking latch spaced distally from the support plate, the locking latch having a rotated position to secure the first PCIe expansion card, and wherein the second component half includes a rotating locking latch spaced distally from the support plate, and wherein the locking latch has a rotated position to secure the second PCIe expansion card.

18. The computing system of claim 12, wherein the first half component and the second half component are attached via a rotational fixture, wherein the second half component is rotated around the rotational fixture to align with the first half component.

19. The riser bracket assembly of claim 15, wherein the first component half has a perpendicular top plate, the support plate of the first component half configured to be attached in parallel to the first type of riser board and the top plate of the first component half configured to support a top surface of the first type of expansion card, and wherein the second component half has a top plate perpendicular to the support plate, the support plate of the second component half configured to be attached in parallel to the first type of riser board opposite the support plate of the first component half, and the top plate of the second component half configured to support a top surface of the second type of expansion card.

* * * * *